(12) United States Patent
Saucy

(10) Patent No.: US 8,070,970 B2
(45) Date of Patent: Dec. 6, 2011

(54) UV-LIGA PROCESS FOR FABRICATING A MULTILAYER METAL STRUCTURE HAVING ADJACENT LAYERS THAT ARE NOT ENTIRELY SUPERPOSED, AND THE STRUCTURE OBTAINED

(75) Inventor: Clement Saucy, La Neuveville (CH)

(73) Assignee: Doniar SA, Bienne (CH)

( * ) Notice: Subject to any disclaimer, the term of this patent is extended or adjusted under 35 U.S.C. 154(b) by 472 days.

(21) Appl. No.: 12/282,751

(22) PCT Filed: Mar. 8, 2007

(86) PCT No.: PCT/CH2007/000126
§ 371 (c)(1),
(2), (4) Date: Sep. 12, 2008

(87) PCT Pub. No.: WO2007/104171
PCT Pub. Date: Sep. 20, 2007

(65) Prior Publication Data
US 2009/0081476 A1 Mar. 26, 2009

(30) Foreign Application Priority Data
Mar. 15, 2006 (EP) .................................... 06405115

(51) Int. Cl.
*B44C 1/22* (2006.01)
(52) U.S. Cl. ........................... 216/28; 428/614; 430/432
(58) Field of Classification Search ................... 216/28; 428/614; 430/438
See application file for complete search history.

(56) References Cited

U.S. PATENT DOCUMENTS

| 5,234,571 A | 8/1993 | Noeker |
| 6,458,263 B1 | 10/2002 | Morales et al. |
| 7,234,859 B2 * | 6/2007 | Kohler et al. ................. 368/326 |
| 2003/0199163 A1 * | 10/2003 | Lee et al. ...................... 438/689 |
| 2004/0144653 A1 | 7/2004 | Jerominek et al. |
| 2004/0164419 A1 * | 8/2004 | Ahn et al. ..................... 257/758 |
| 2006/0121694 A1 * | 6/2006 | Tamura ......................... 438/458 |

FOREIGN PATENT DOCUMENTS

| EP | 0 567 332 A2 | 10/1993 |
| EP | 0 851 295 A1 | 7/1998 |
| WO | 2005-054547 A2 | 6/2005 |
| WO | WO 2005054547 * | 6/2005 |

OTHER PUBLICATIONS

A. B. Frazier et al.; "Metallic Microstructures Fabricated Using Photosensitive Polyimide Electroplating Molds"; Journal of Microelectromechanical Systems, vol. 2, No. 2, p. 87-94, Jun. 1993.
International Search Report of PCT/CH2007/000126, date of mailing Nov. 5, 2007.
International Preliminary Report on Patentability of International Application No. PCT/CH2007/000126 dated Nov. 17, 2008 with Forms PCT/IB/373 and PCT/ISA/237.

* cited by examiner

*Primary Examiner* — Duy-Vu Deo
*Assistant Examiner* — Mahmoud Dahimene
(74) *Attorney, Agent, or Firm* — Westerman, Hattori, Daniels & Adrian, LLP

(57) ABSTRACT

A layer of photoresist is spread on a metal substrate and heated, this layer is exposed through a mask to UV irradiation, the parts not photocured are developed, by dissolving them, so as to obtain a mold, a first layer of metal or of an alloy is galvanically deposited in the open parts of the mold, the metal structure and the mold are leveled by machining so as to obtain a plane upper surface, a metal ply layer is deposited on the entire upper surface, and then the above steps are repeated. A second layer of metal or an alloy is galvanically deposited in the open parts of the mold, the multilayer metal structure obtained is detached from the substrate by delamination and the photoresist is cured, the photoresist is separated so as to free the multilayer metal structure, and then that portion of the metal ply layer or layers which is not inserted between two electrodeposited metal layers is removed.

9 Claims, 4 Drawing Sheets

UV-LIGA PROCESS FOR FABRICATING A MULTILAYER METAL STRUCTURE HAVING ADJACENT LAYERS THAT ARE NOT ENTIRELY SUPERPOSED, AND THE STRUCTURE OBTAINED

The present invention relates to a novel process for the UV-LIGA fabrication of a multilayer metal structure having adjacent layers that are not entirely superposed, and also to a novel multilayer metal structure having adjacent layers that are not entirely superposed which can be obtained by this process.

DGC Mitteilungen No. 104, 2005 mentions the use of the technology called LIGA (LIthographie Galvanik Abformung [*Lithography, Electroforming, Molding*], a method devised by W. Ehrfeld of the Karlsruhe Nuclear Research Center in Germany) for the fabrication of high-precision metal components for timepieces, such as for example anchor pallets or escapement wheels. This process has the drawback of requiring expensive equipment, namely a synchrotron, to generate the X-ray irradiation. It therefore cannot be conveniently used in the watchmaking industry.

A. B. Frazier el al., Journal of Microelectromechanical Systems, 2, 2, Jun. 1993, describes the fabrication of metal structures by electrodepositon of metal in molds made of a polyimide-based photoresist, these being prepared by means of a process using a technology called UV-LIGA, similar to the LIGA technology but with UV illumination instead of irradiation with X-rays.

The process used for fabricating these metal structures comprises the following steps:
  creation, on a silicon support wafer, of a sacrificial metal layer and a seed layer for the electrodeposition;
  deposition of a photosensitive polyimide layer by spin coating;
  UV illumination through a mask corresponding to the desired impression;
  development, by dissolving the non-irradiated parts so as to obtain a polyimide mold;
  electrodeposition of nickel in the open part of the mold up to the top of the latter so as to obtain a substantially planar upper surface;
  deposition of a thin chromium layer by vacuum evaporation;
  deposition of a photosensitive polyimide layer on this thin chromium layer by spin coating, UV illumination through a new mask corresponding to the desired impression, development, by dissolving the non-irradiated parts so as to obtain a new polyimide mold, removal of the thin chromium layer in the open part of the mold using a hydrochloric acid solution and electrodeposition of nickel in the open part of the mold; and
  removal of the sacrificial layer and separation of the metal structure obtained by electrodeposition from the polyimide mold.

That process is used to fabricate a metal plate surmounted by a protuberance of parallelepipedal general shape (V. and FIG. 9, page 92), the second layer being entirely superposed on the first layer of larger area. It is mentioned (in the last paragraph of V. page 93) that the same structure, but inverted with the protuberance of parallelepipedal general shape below the plate, has also been fabricated using the same technique, but the structure actually obtained is neither shown nor described.

The Applicant has found that implementing such a process when the second electrodeposited layer is not entirely superposed on the first layer results in a nonvertical growth of the metal deposited and in the formation of bubbles above the resist.

EP 0 851 295 discloses another UV-LIGA process for the fabrication of multilayer metal structures that is similar to the process taught by Frazier et al., applying to the fabrication of a gearwheel surmounted by a bilayer pinion having entirely superposed layers (Example 1) or of a three-layer thermal flux microsensor having entirely superposed layers (Example 3). If this process were to be used to fabricate a structure having two adjacent layers that are not entirely superposed, the abovementioned drawbacks would also be present.

A process has also been proposed, in US 2004/0144653, for fabricating microstructures on a substrate formed from a glass, ceramic or semiconductor wafer. This microstructure comprises a base member on which a support member is selectively formed by electroforming, so as to support a microplatform. The process also relates to the selective electroforming of the microplatform and to the formation of flexible hinge members for connecting the microplatform to the support and for allowing relative movement between them.

The nature of the substrate used to produce this microstructure is too fragile to allow thickness adjustment of the various layers to be carried out by machining. Now, it turns out that the quality of the subsequent layer or layers deposited is not as good if the base layer is not perfectly planar and polished.

Moreover, it turns out that the metal structures obtained cannot be separated from the substrate without being separated from one another. Now, in particular if it is necessary to remove the resist from a blind hole or from another part that is difficult to access, lying in particular on the obverse side of the structure, it can be removed only in a solvent bath, which method does not guarantee that the blind hole is completely stripped of its resist.

The problem or object of the invention is to find a process for fabricating a multilayer metal structure comprising at least two adjacent layers that are not entirely superposed that remedies at least some of these drawbacks.

This problem is solved by the invention as defined by the claims.

Thus, the invention relates to a process for the UV-LIGA fabrication of a multilayer metal structure comprising at least a second layer adjacent to a first layer and not entirely superposed therewith, which process comprises the following steps:
  a) a photoresist layer is spread over a flat substrate made of bulk metal;
  b) the photoresist layer is heated, if necessary to evaporate the solvent;
  c) the photoresist layer is exposed through a mask corresponding to the desired impression, to UV irradiation of 100 to 2000 mJ/cm$^2$ measured at a wavelength of 365 nm;
  d) if necessary to complete the photocuring or photodecomposition of the irradiated parts, an annealing operation is carried out on the layer obtained from the step c);
  e) the development step is carried out, by dissolving the parts that have not undergone photocuring or photodecomposition, so as to obtain a cured photoresist mold;
  f) a first layer of a metal or alloy is electrodeposited in the open parts of the mold, and the metal structure and the mold are leveled by machining so as to obtain a planar upper surface;
  g) a metal tie layer is deposited by vacuum evaporation on the entire planar upper surface, and then steps a), b), c), d) and e) are repeated;

h) a second layer of a metal or alloy is electrodeposited in the open parts of the mold in the presence of the metal tie layer and the metal structure and the mold are leveled by machining so as to obtain a planar upper surface;

i) if necessary, steps g) and h) are repeated so as to form the desired multilayer metal structure; and j) the substrate is detached by delaminating the multilayer metal structure obtained and the cured photoresist, the photoresist is separated so as to free the multilayer metal structure then that part of the metal tie layer or layers which has not been inserted between two electrodeposited metal layers is removed.

The expression "a second layer adjacent to a first layer and not entirely superposed therewith" means that the outline of the second layer does not lie entirely within the vertical elevation of the outline of the first layer.

The bulk metal wafer forming the substrate in general has a thickness of 1 to 5 mm, formed from a conductive metal and/or alloy capable of seeding (initiating) the electroforming reaction by acting as cathode. This plate may for example be made of copper, brass or stainless steel. Preferably it is made of stainless steel.

The upper surface of the bulk metal plate, intended to be in contact with the electrolytic bath, may be polished or textured, for example by shot peening or by chemical, mechanical or laser etching.

The bulk metal plate is cleaned and prepared for the electroforming by a suitable treatment. When it is made of stainless steel, one suitable treatment consists for example in carrying out the following operations: cleaning with an alkaline solution, then neutralization in an acid medium to passivate its surface, then rinsing with distilled water and drying.

The photoresist is either a negative photoresist, based on a resin capable of curing under the action of UV radiation in the presence of a photoinitiator, or a positive photoresist based on a resin that can decompose under the action of UV radiation in the presence of a photoinitiator. The negative photoresist is for example based on an epoxy resin, an isocyanate resin or an acrylic resin. One advantageous epoxy resin is the octofunctional epoxy resin SU-8 (from Shell Chemical). It is used in general in the presence of a photoinitiator chosen from triarylsulfonium salts, for example those described in the patents U.S. Pat. No. 4,058,401 and U.S. Pat. No. 4,882,245. The positive photoresist is for example based on a phenol-formaldehyde resin of the novalac type in the presence of a DNQ (diazonaphthoquinone) photoinitiator.

The photoresist may be deposited by spin coating or by another technique, such as for example dip coating, roller coating, extrusion coating, spray coating or lamination (in the case of dry films, for example based on an acrylic resin). The preferred coating technique is spin coating.

The maximum photoresist thickness for inducing the desired effect (photocuring or photodecomposition) under the irradiation conditions of step c) is 1 mm. The maximum thickness of the photoresist layer that can be spread in one rotation using the spin coating technique is 150 µm. Depending on the desired thickness of the photoresist, the bulk metal substrate will be coated one or more times therewith.

The conditions for the optional heating of the photoresist, to remove the solvent in step b), are chosen according to the nature and the thickness of the photoresist as per the information provided by its manufacturer. For a photoresist based on an SU-8 epoxy resin with a thickness of 140 µm, step b) consists for example in heating it at 65° C. for 5 to 10 minutes and then at 95° C. for a time of 30 to 60 minutes. For a photoresist based on a dry acrylic film, this heating step to evaporate the solvent is unnecessary.

If it is necessary to coat with the photoresist several times, and to heat the photoresist in order to evaporate the solvent, step b) will be carried out at the end of step a), after the first coating with the photoresist, and steps a) and b) will be repeated the number of times necessary.

Step c) consists in exposing the photoresist layer through a mask corresponding to the desired impression to a UV irradiation of 100 to 2000 mJ/cm$^2$ measured at a wavelength of 365 nm. This irradiation causes photocuring of the resin (negative photoresist) or photodecomposition of the resin (positive photoresist).

Step d) consists in carrying out, if necessary in order to complete the photocuring or photodecomposition of step c), an annealing operation on the layer obtained after this step. For some photoresists, for example photoresists based on a dry acrylic film, this heating step to complete the photocuring is unnecessary.

Step e) consists of the development operation, by dissolving the non-irradiated parts (negative photoresist) or the irradiated parts (positive resist) using a suitable aqueous solution or a solvent, chosen according to the nature of the photoresist as per the information provided by its manufacturer. Examples of suitable aqueous solutions are weak-base alkaline solutions, for example sodium carbonate solutions, and examples of suitable solvents are GBL (gamma-butyrolactone), PGMEA (propylene glycol methyl ethyl acetate) and isopropanol. It is advantageous to use PGMEA as development solvent or solution in the case of the SU-8 epoxy resin and to use a 1% sodium carbonate solution or isopropanol in the case of an acrylic resin.

Step f) consists in electrodepositing a first layer of a metal or alloy in the open parts of the photoresist mold and in machining it to obtain a substantially planar upper surface.

When the substrate is formed from a bulk metal plate, it is possible to machine the metal structure and the mold on the substrate and therefore to level them so as to obtain a planar upper surface to the desired level. It is therefore no longer necessary to monitor very precisely the rise of the electroformed metal in the mold. This level may be chosen to be slightly above the desired thickness (by 10 to 30 µm) and then a leveling operation is carried out by machining, in particular by abrasion and polishing, the metal structure and the mold so as to obtain a planar upper surface, the surface irregularities of which do not exceed about 1 µm. This solution has the advantage of allowing better thickness control in implementing the process and of improving the quality of the structure obtained, since the subsequent electrodeposition is carried out more uniformly on a polished planar surface than on a surface having irregularities.

It is frequently the case in electroforming to use, as metal, nickel, copper, gold or silver and, as alloy, gold-copper, nickel-cobalt, nickel-iron, nickel-manganese or nickel-phosphorus. The electroforming conditions, in particular the bath composition, the system geometry, the voltages and current densities, are chosen for each metal or alloy to be electrodeposited according to the techniques well known in the electroforming art (cf. for example G. A. Di Bari "*electroforming*", Electroplating Engineering Handbook", 4th Edition, edited by L. J. Durney, published by Van Nostrand Reinhold Company Inc., New York, USA 1984).

Step g) consists in depositing a metal layer, called here a metal tie layer, over the entire planar upper surface by vacuum evaporation and then in repeating steps a), b), c), d) and e).

This vacuum evaporation or PVD may be carried out under the usual conditions well known in the prior art (cf. for example Donald M. Mattox, 1998, "*Handbook of Physical Vapour Deposition (PVD) Processing*", published by William Andrew Publishing, 1998).

The thickness of the metal tie layer is in general from 50 to 500 nm, preferably 100 to 300 nm and particularly 120 to 250 nm.

The vaporized metal is chosen, according to the electroforming metal, for its capability of bending to the electroformed metal and to the photoresist on the one hand, and of seeding the electrodeposition reaction on the other. The metal may for example be nickel, copper, gold, chromium on gold or nickel on titanium.

During step g), steps a), b), c), d) and e) are carried out in a similar manner to that described above in the case of these steps with the metal tie layer of step a) as substrate and using a new mask corresponding to the desired impression for the new layer. A second cured photoresist mold is thus obtained.

Step h) consists in electrodepositing a second layer of a metal or alloy in the open parts of the second mold, in the presence of the metal tie layer, and in machining a substantially planar upper surface. The presence of the metal tie layer ensures that the deposited metal grows vertically and prevents the formation of bubbles, even when the second layer is not entirely superposed on the first layer. The metal or alloy of the second layer may be identical to or different from that of the first layer. In general, it is the same metal or alloy.

Step i) consists in repeating, if necessary, steps g) and h) so as to obtain the desired multilayer metal structure. This repetition is not necessary for the production of a bilayer metal structure.

Step j) consists in detaching the multilayer metal structure obtained and the cured photoresist from the substrate by delamination, in separating the photoresist so as to free the multilayer metal structure and then in removing that part of the metal tie layer or layers not inserted between two electrodeposited metal or alloy layers.

The lower face of the metal structure detached by delaminating the upper face from the bulk metal surface reproduces the surface finish of the latter. Thus, it will either be textured (if the upper face of the metal substrate is textured, for example by etching or shot peening) or of polished appearance (if the upper face of the metal substrate has undergone polishing). In the latter case, to the naked eye, the polished appearance of the surface of the lower face of the structure cannot be distinguished from the polished appearance obtained, where appropriate, by polishing the surface of the upper face. When observed under an optical microscope with a 50× magnification, suitable illumination and a certain orientation, or under a scanning electron microscope, or with the use of topographical surface analysis systems, it is possible however to distinguish these two surfaces.

The separation or stripping of the photoresist is accomplished in general by chemical etching or plasma treatment. Plasma treatment provides a directional action, this making it possible in particular for the resist to be properly removed from for example blind holes, something that cannot be guaranteed by chemical etching. Furthermore, the fact that this treatment is applied to the entirety of the structures band to one another after the lamination makes it possible to keep all the structures in the same orientation with respect to the plasma source and thus treat preferential parts of the structures.

After the photoresist has been stripped, part of the metal tie layer or layers is not inserted between two electroformed metal layers and must therefore be removed. This removal is carried out in general by etching this metal in an appropriate bath that does not etch the electroformed metal. For example when the metal tie layer is gold, this removal is carried out in a degolding bath based on a cyanide solution.

The process of the invention may also be used to manufacture a multilayer metal structure comprising a metal or alloy layer entirely superposed on the second layer and/or a metal or alloy layer on which said first layer is entirely superposed. The metal or the alloy of the layer entirely superposed on said second layer may be identical to or different from that of said second layer and the metal or alloy of the layer on which said first layer is entirely superposed may be identical to or different from that of said first layer. In general, for each of these cases, it is the same metal or alloy.

According to one method of implementing the process of the invention, after step h) or step i), and before step j), a metal or alloy layer entirely superposed on the metal or alloy layer deposited in step h) or in step i) is produced by UV-LIGA. The person skilled in the art will find in the literature, and in particular in Frazier et al. mentioned above, the conditions for depositing a metal layer entirely superposed on a metal layer. These may for example be the following: steps a), b), c), d) and e) are repeated, then that surface of the electroformed metal not covered with cured photoresist is activated by an electrochemical treatment and step h) is repeated. This activation is carried out by applying a reverse current, making the electroformed metal act as anode, using techniques well known in the surface treatment art. What is thus obtained is a multilayer metal structure comprising at least one second layer adjacent to a first layer and not entirely superposed on the latter and another layer entirely superposed on said second layer.

According to another method of implementing the process of the invention, prior to step a), a metal or alloy layer, on which said first metal or alloy layer is entirely superposed, is produced by UV-LIGA. A person skilled in the art will find in the literature, and in particular in Frazier et al. mentioned above, the conditions for depositing a metal layer entirely superposed on a metal layer. The conditions for this deposition may for example be the following: steps a), b), c), d) and e) are carried out, then that surface of the electroformed metal which is not covered with cured photoresist is activated by an electrochemical treatment and step h) is carried out. What is thus obtained is a multilayer metal structure comprising at least a second layer adjacent to a first layer and not entirely superposed on the latter and another layer on which said first layer is entirely superposed.

The process of the invention makes it possible to manufacture metal structures by UV-LIGA which comprise at least one second layer adjacent to a first layer and not entirely superposed on the latter, and which do not have defects due to the formation of bubbles and to non-vertical growth of the electroformed metal. Structures of such quality could not be obtained with the known processes.

The invention thus also relates to a novel multilayer metal structure comprising at least a second layer adjacent to a first layer and not entirely superposed on the latter, which can be obtained by the process defined above.

Other features and advantages of the invention will become apparent on reading the following detailed description, with reference to the appended drawings which illustrate, schematically and by way of example, a few ways of implementing the process of the invention.

Figure 3A:
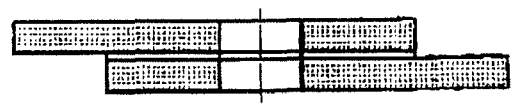
Figure 3B:
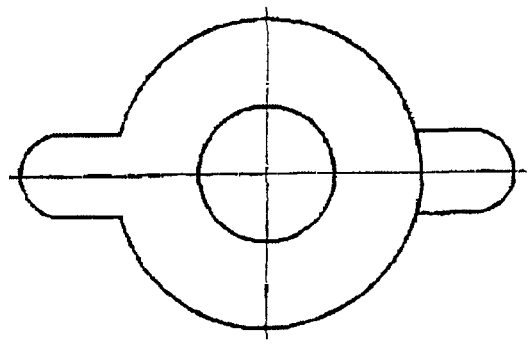
Figure 4A:
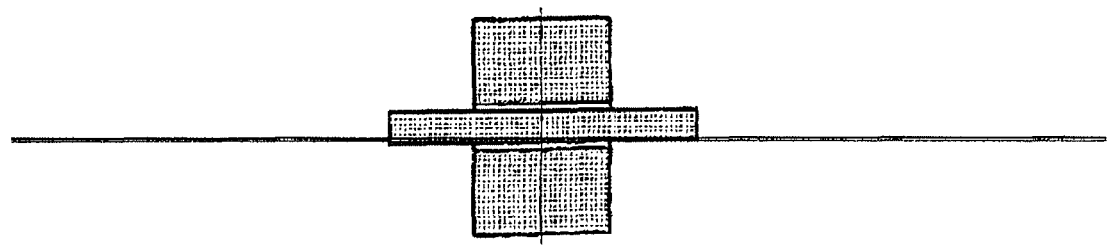
Figure 4B:
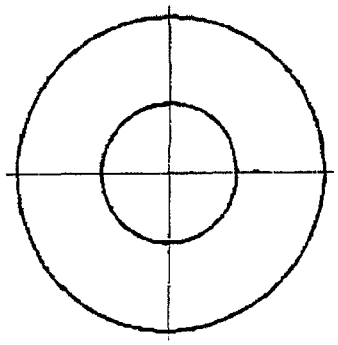

FIGS. 3A and 3B are a sectional view and a top view, respectively, of a day finger having a bilayer structure in which the layers are not entirely superposed; and FIGS. 4A and 4B are a sectional view and a top view, respectively of a spacer having a three-layer structure in which the second layer is not entirely superposed on the first layer and the third layer is entirely superposed on the second layer.

The following examples describe the manufacture of this bilayer structure, this day finger and this spacer by the process of the invention, with reference to these figures.

EXAMPLE 1

Manufacture of a Bilayer Structure with Blind Holes

Figure 1A:
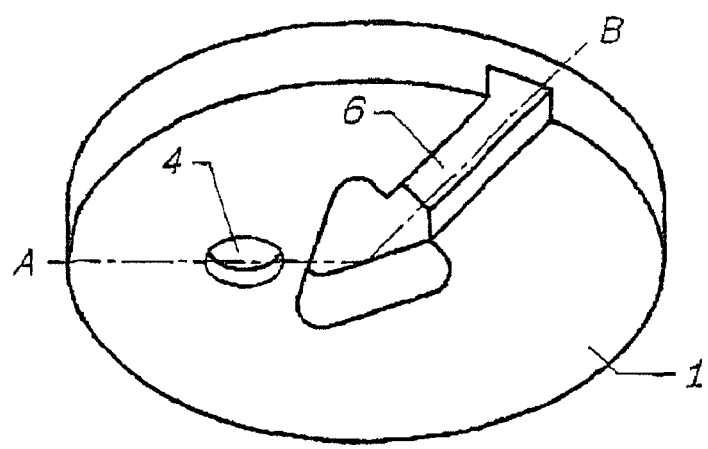
FIGS. 1A to 1C are a perspective view from below, a perspective view from above and a sectional view on the line AB of the perspective view from below, respectively, of a bilayer structure consisting of not entirely superposed layers and blind holes.
Figure 1B:
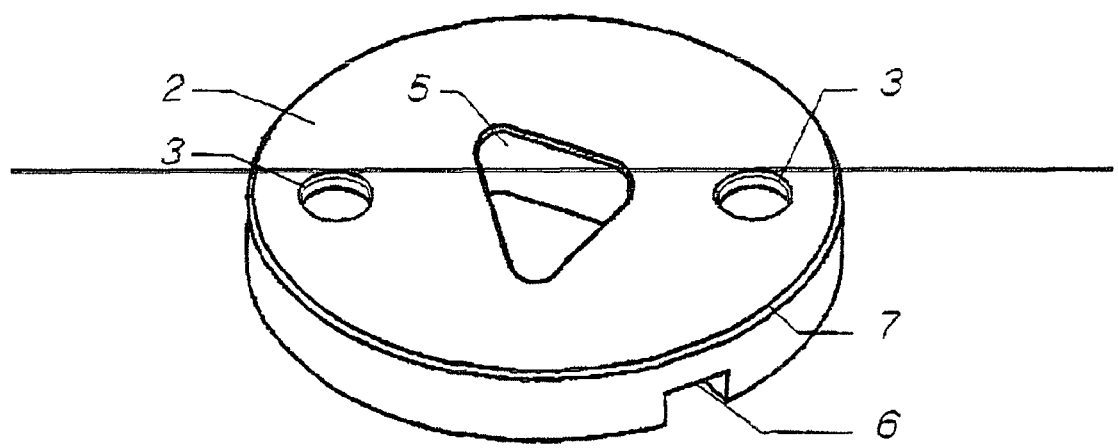
Figure 1C:
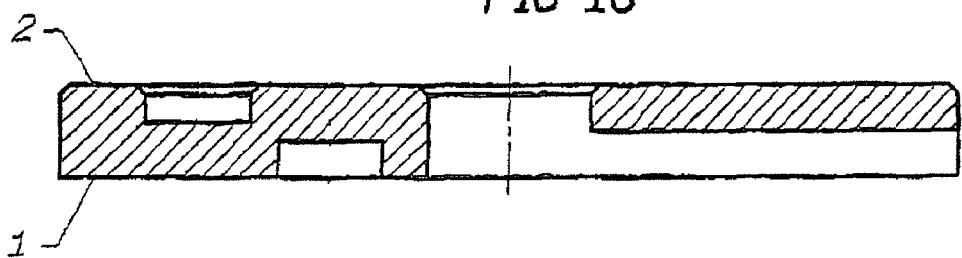

FIGS. 1A, 1B and 1C represent a bilayer structure comprising a lower face 1, an upper face 2, two blind holes 3 on the top of the face, a blind hole 4 on its lower face, a shaped hole 5, a recess 6 and beveled parts 7.

Figure 2A:
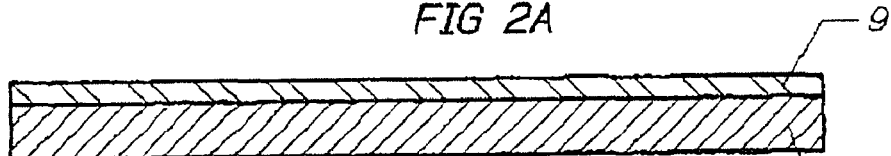
FIGS. 2A to 2I are sectional views showing the various steps in the manufacture of the bilayer structure of FIGS. 1A to 1C.

FIG. 2A shows the structure obtained after step b), which comprises a photoresist layer 9 covering the substrate 8. This structure was obtained according to the protocol described below.

A substrate 8 formed from a stainless plate 1 mm in thickness and 150 mm in diameter was cleaned and prepared for the electroforming by cleaning using an alkaline solution, followed by neutralization in an acid medium in order to passivate its surface and then rinsing with distilled water and drying. Next, the substrate 8 was coated with a first layer of negative photoresist based on the octofunctional epoxy resin SU-8-2100 (from Shell Chemical) with a thickness of 140 µm by spin coating and then heated to evaporate the solvent for 5 minutes at 65° C. and then for 35 minutes at 95° C. Next, the first photoresist layer was coated with a thickness of 140 µm with a second layer of the same photoresist by spin coating, and then heated to evaporate the solvent for 7 minutes at 65° C. and then 60 minutes at 95° C.

Figure 2B:
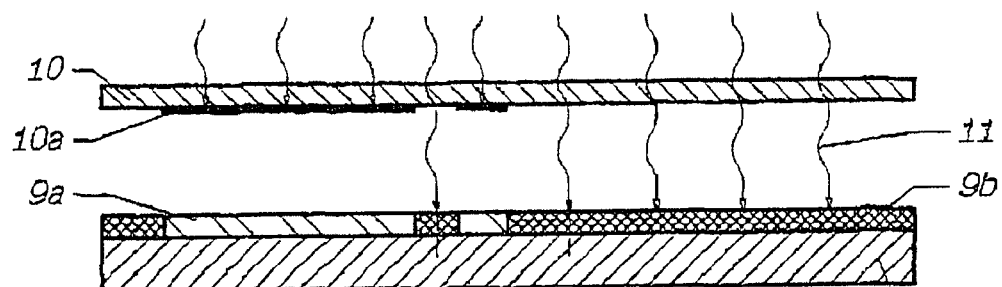

FIG. 2B corresponds to step c) of illuminating the photoresist with UV of about 600 mJ/cm$^2$ centered on 365 nm through a mask corresponding to the desired impression. Distinguished in this figure are the mask, comprising a support 10 transparent to the UV 11, and opaque zones 10a formed by deposition of chromium. The same support forming the mask may comprise a large number of zones corresponding to as many structures that can be manufactured as a single batch, all the zones being obtained with a very high contour resolution by photolithography, a technique well known in the microelectronics industry.

This irradiation caused the resist to undergo photocuring in the exposed zones 9b, the unexposed zones 9a remaining uncured.

Figure 2C:
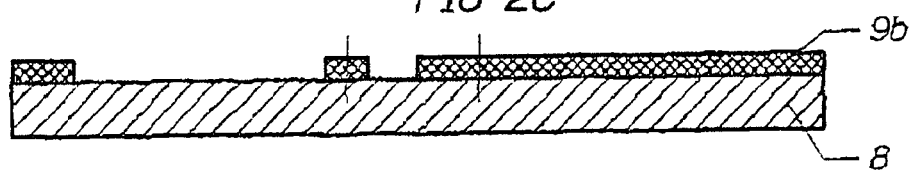

FIG. 2C shows the structure obtained after the step e).

The layer obtained after step c) was annealed, in order to complete the curing, for 2 minutes at 65° C. and then 20 minutes at 95° C., then the unexposed photoresist was dissolved by passing it through three successive PGMEA baths (of increasing purity) for 20 minutes, followed by rinsing in an isopropyl alcohol bath and drying. FIG. 2C shows the cured photoresist mold 9b superposed on the substrate 8.

Figure 2D:
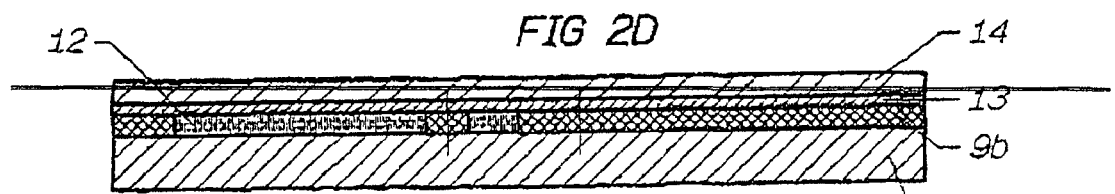

FIG. 2D shows the structure obtained after carrying out step f) and, according to step g) repeating steps a) and b).

During step f), nickel was electrodeposited in the open parts of the cured photoresist mold and a leveling operation was carried out by abrasion and polishing so as to obtain a planar upper surface, then a gold tie layer of about 200 nm was deposited by vacuum evaporation and the steps a) and b) were repeated with two successive 125 µm layers of the same photoresist based on the epoxy resin SU-8-2100, the first layer being heated for 5 minutes at 65° C. and then 35 minutes at 95° C., and the second layer being heated for 7 minutes at 65° C. and then 60 minutes at 95° C.

FIG. 2D shows the photoresist layer 14 above the gold layer 13 covering the cured photoresist 9b and the electroformed layer 12 on top of the substrate 8.

Figure 2E:
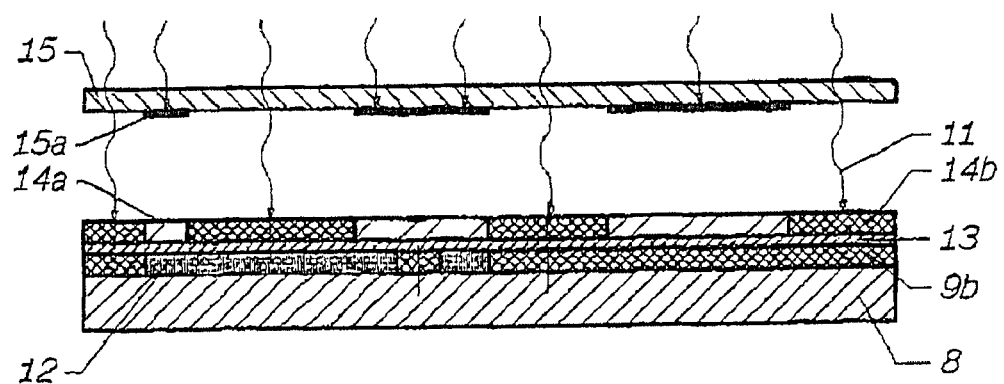

FIG. 2E corresponds to the repetition of step c) with UV illumination, of about 550 mJ/cm$^2$ centered on 365 nm, of the photoresist through a new mask corresponding to the desired impression. This figure shows the mask comprising a UV-transparent support 15 and opaque zones 15a formed by depositing chromium. This UV irradiation 11 caused the resist to undergo photocuring in the exposed zones 14b, the unexposed zones 14a remaining uncured.

Figure 2F:
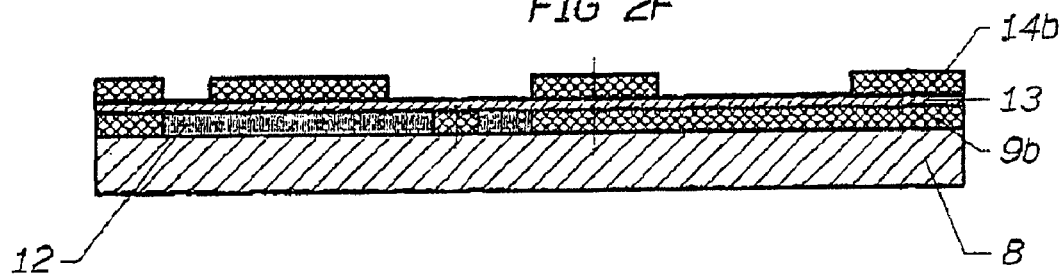

FIG. 2F shows the structure obtained after step g). The layer obtained after repeating step c) was annealed, in order to complete the curing, for 1 minute at 65° C. and then 15 minutes at 95° C., then the unexposed photoresist was dissolved by passing it through three successive PGMEA baths (of increasing purity) for 15 minutes, followed by rinsing in an isopropyl alcohol bath and drying. This figure shows the second cured photoresist mold 14b on top of the metal tie layer 13, on top of the first cured photoresist mold 9b and the electroformed nickel layer 12 on top of the substrate 8.

Figure 2G:
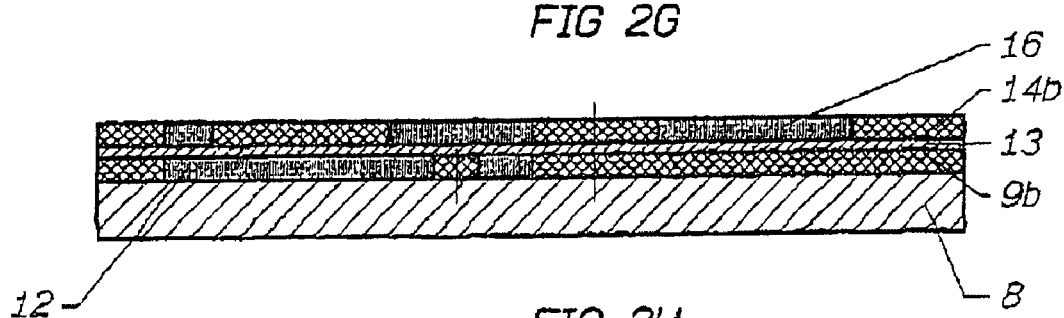

FIG. 2G shows the structure obtained after step h). A second layer of nickel was electrodeposited to a height slightly greater than (by 10 to 30 µm) the intended thickness, then a leveling operation was carried out by abrasion and polishing so as to obtain a planar upper surface. This figure shows the second cured resist mold 14b and the second electroformed layer 16 on top of the metal tie layer 13, on top of the first cured mold 9b and the first electroformed layer 12 on top of the substrate 8.

Figure 2H:
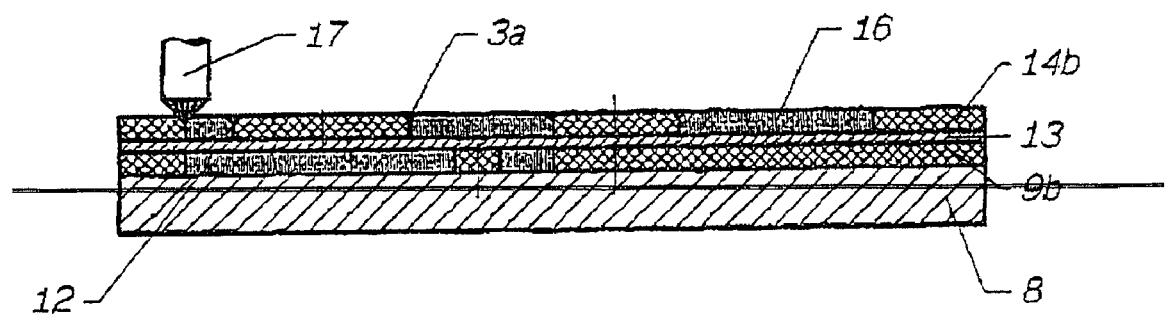

FIG. 2H shows a beveling operation carried out on the structure obtained after step h). This figure shows (additionally to FIG. 2G) a milling cutter 17 and a beveled hole 3a.

Figure 2I:
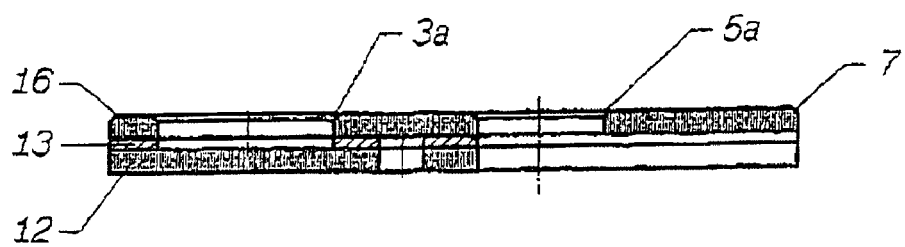

FIG. 2I, which corresponds to the sectional view of FIG. 1C, shows the bilayer structure with blind holes that is obtained after step j), after the metal substrate has been detached by delamination, removal of the cured photoresist by a plasma treatment and stripping, by degolding, that part of the gold layer not inserted between the two electrodeposited nickel layers. In this figure may be seen the first nickel layer 12, the gold layer 13, the second nickel layer 16 and the bevelings 3a, 5a and 7. As seen on FIGS. 2F-2I, an open part of the mold for the second layer was formed to extend over a non-open part of the mold for the first layer, so as to obtain the detached multilayer metal structure in which the first layer has a recess and the second layer overhangs the recess.

The delamination of the electrodeposited metal structures makes it possible to keep them together with the resist that connects them. Thanks to this method of separating the structures, it is then possible to turn all the entire structures upside down and subject them to a plasma treatment which, because of its directionality, enables all the resist facing the plasma source to be removed. This method of removing the resist makes it possible in particular to completely empty the blind holes and other parts of the metal structures difficult to reach, by simply dipping the loose structures in a bath, especially when a blind hole has a very small diameter, as in the case of the hole 4 in FIG. 1C.

Owing to the above process, it is possible to adopt the following sequence of operations in order to avoid treating the structures loose when eliminating the gold tie layer:
1) beveling operation using the milling cutter 17 (FIG. 2H);
2) removal of the photoresist 14b by a plasma treatment;
3) stripping, by degolding, those parts of the layer 13 which are not located between the layers 12 and 16;
4) detaching the multilayer metal structure from the substrate by delamination; and
5) separating the photoresist 9b by a plasma treatment.

EXAMPLE 2

Manufacture of a Day Finger

The day finger shown in FIGS. 3A and 3B was produced as described below.

A substrate formed from a stainless steel plate 1 mm in thickness and 150 mm in diameter was cleaned and prepared for the electroforming by cleaning with an alkaline solution, followed by neutralization in an acid medium to passivate its surface, and then rinsing with distilled water and drying. Next, the substrate was coated with a first layer of negative photoresist based on the octofunctional epoxy resin SU-8-2100 (Shell Chemical) with a thickness of 140 µm by spin coating, and then heated to evaporate the solvent for 5 minutes at 65° C. and then 35 minutes at 95° C. Next, the first photoresist layer was coated with a second layer of the same photoresist with a thickness of 140 µm by spin coating, and then heated to evaporate the solvent for 7 minutes at 65° C. and then 60 minutes at 95° C.

Next, step c) was carried out with UV illumination, of about 750 mJ/cm$^2$ centered on 365 nm, of the photoresist through a mask corresponding to the desired impression. This irradiation caused the resist to undergo photocuring in the exposed zones, the unexposed zones remaining uncured.

Next, the layer obtained was annealed, in order to complete the curing, for 2 minutes at 65° C. and then 20 minutes at 95° C., and then the unexposed photoresist was dissolved by passing it through three successive PGMEA baths (of increasing purity) for 20 minutes, followed by rinsing in an isopropyl alcohol bath and drying. What was thus obtained was a cured photoresist mold on top of the stainless steel substrate.

Next, nickel was electrodeposited in the open parts of the cured photoresist mold and a leveling operation carried out by abrasion and polishing so as to obtain a planar upper surface, a gold layer of about 200 nm was deposited by vacuum evaporation and the steps a) and b) were repeated with two successive 120 µm layers of the same photoresist based on the epoxy resin SU-8-2100, the first layer being heated for 5 minutes at 65° C. and then 35 minutes at 95° C. and the second layer being heated for 7 minutes at 65° C. and then 60 minutes at 95° C.

Next, step c) was repeated with UV illumination, of about 700 mJ/cm$^2$ centered on 365 nm, of the photoresist through a new mask corresponding to the desired impression. This UV irradiation caused the resist to undergo photocuring in the exposed zones, the unexposed zones remaining uncured.

Next, in order to complete the curing, an annealing operation was carried out for 1 minute at 65° C. and then 15 minutes at 95° C., then the unexposed photoresist was dissolved by passing it through three successive PGMEA baths (of increasing purity) for 15 minutes, rinsing in an isopropyl alcohol bath and drying. What was thus obtained was a second cured photoresist mold on top of the gold tie layer, on top of the first cured photoresist mold and the electroformed nickel layer on top of the substrate.

Next, a second layer of nickel was electrodeposited to a height slightly greater than (by 10 to 30 µm) the intended thickness, then a leveling operation was carried out by abrasion and polishing so as to obtain a planar upper surface.

Next, the substrate was detached from the metal structure by delamination, the cured photoresist removed by a plasma treatment and the gold layer in contact with the outside removed by degolding. What was thus obtained was the day finger shown in FIGS. 3A and 3B.

EXAMPLE 3

Manufacture of a Spacer

The manufacture of a spacer illustrated in FIGS. 4A and 4B started with a substrate formed from a stainless steel plate 1 mm in thickness and 150 mm in diameter, which was cleaned and prepared for the electroforming with an alkaline solution, and then neutralization in an acid solution to passivate its surface, followed by rinsing with distilled water and drying. Next, the substrate was coated with a first layer of negative photoresist based on the octofunctional epoxy resin SU-8-2100 (Shell Chemical) with a thickness of 140 µm by spin coating, and then heated to evaporate the solvent for 5 minutes at 65° C. and then 35 minutes at 95° C. Next, the first photoresist layer was coated with a second layer of the same photoresist with a thickness of 140 µm by spin coating, and then heated to evaporate the solvent for 7 minutes at 65° C. and then 60 minutes at 95° C.

Next, step c) was carried out with UV illumination, of about 600 mJ/cm$^2$ centered on 365 nm, of the photoresist through a mask corresponding to the desired impression. This irradiation caused the resist to undergo photocuring in the exposed zones, the unexposed zones remaining uncured.

Next, the layer obtained was annealed, in order to complete the curing, for 1 minute at 65° C. and then 15 minutes at 95° C., and then the unexposed photoresist was dissolved by passing it through three successive PGMEA baths (of increasing purity) for 20 minutes, followed by rinsing in an isopropyl alcohol bath and drying. What was thus obtained was a cured photoresist mold on top of the stainless steel substrate.

Next, nickel was electrodeposited in the open parts of the cured photoresist mold and a leveling operation carried out by abrasion and polishing so as to obtain a planar upper surface, a gold layer of about 150 nm was deposited by vacuum evaporation and the steps a) and b) were repeated with two successive 90 µm layers of the same photoresist based on the epoxy resin SU-8-2100, the first layer being heated for 5 minutes at 65° C. and then 20 minutes at 95° C. and the second layer being heated for 60 minutes at 45° C. and then 60 minutes at 95° C.

Next, step c) was repeated with UV illumination, of about 500 mJ/cm$^2$ centered on 365 nm, of the photoresist through a new mask corresponding to the desired impression. This UV irradiation caused the resist to undergo photocuring in the exposed zones, the unexposed zones remaining uncured.

Next, in order to complete the curing, an annealing operation was carried out for 1 minute at 65° C. and then 15 minutes at 95° C., then the unexposed photoresist was dissolved by passing it through three successive PGMEA baths (of increasing purity) for 15 minutes, rinsing in an isopropyl alcohol bath and drying. What was thus obtained was a second cured photoresist mold on top of the gold tie layer, on top of the first cured photoresist mold and the electroformed nickel layer on top of the substrate.

Next, a second layer of nickel was electrodeposited to a height slightly greater than (by 10 to 30 µm) the intended height, then a leveling operation was carried out by abrasion and polishing so as to obtain a planar upper surface.

Steps a) and b) were repeated with two successive 140 μm layers of the same photoresist based on the epoxy resin SU-8-2100, the first layer being heated for 5 minutes at 65° C. and then 35 minutes at 95° C. and the second layer heated for 7 minutes at 45° C. and then 60 minutes at 95° C.

Next, step c) was repeated with UV illumination, of about 600 mJ/cm² centered on 365 nm, of the photoresist through a new mask corresponding to the desired impression. This UV irradiation caused the resist to undergo photocuring in the exposed zones, the unexposed zones remaining uncured.

Next, in order to complete the curing, an annealing operation was carried out for 1 minute at 65° C. and then 15 minutes at 95° C., then the unexposed photoresist was dissolved by passing it through three successive PGMEA baths (of increasing purity) for 15 minutes, followed by rinsing in an isopropyl alcohol bath and drying. What was thus obtained was a third cured photoresist mold on top of the first and second electroformed nickel layers.

The upper surface of this second electroformed nickel layer not covered with cured photoresist was activated by an electrochemical treatment.

Next, a third coating of nickel was electrodeposited up to a height slightly greater (by 10 to 30 μm) than that of the intended height, followed by a leveling operation by abrasion and polishing so as to obtain a planar upper surface.

If the third electrodeposited nickel layer is entirely superposed on the second, the intermediate tie layer may be omitted.

Next, the substrate was detached from the metal structure by delamination, the cured photoresist removed by a plasma treatment and the gold layer in contact with the outside was removed by degolding. What was thus obtained was the spacer shown in FIGS. 4A and 4B.

The invention claimed is:

1. A process for the UV-LIGA fabrication of a multilayer metal structure comprising a first layer having a recess, at least a second layer adjacent to a first layer and not entirely superposed therewith, said second layer overhanging the recess, which process comprises the following steps:
   a) spreading a photoresist layer over a flat substrate made of bulk metal;
   b) heating the photoresist layer, if necessary to evaporate the solvent;
   c) exposing the photoresist layer through a mask corresponding to the desired impression, to UV irradiation of 100 to 2000 mJ/cm² measured at a wavelength from 365 nm;
   d) if necessary to complete the photocuring or photodecomposition of the irradiated parts, carrying out an annealing operation on the layer obtained from the step c);
   e) carrying out a development step by dissolving the parts that have not undergone photocuring or photodecomposition, so as to obtain a cured photoresist mold having open parts;
   f) electrodepositing a first layer of a metal or alloy in the open parts of the mold, which is a first mold, and levelling the metal structure and the first mold by machining so as to obtain a planar upper surface;
   g) depositing a metal tie layer by vacuum evaporation on the planar upper surface of the metal or alloy and the mold, and then repeating steps a), b), c), d) and e) so as to form a second mold having open parts, wherein an open part of the second mold extends over a non-open part of the first mold;
   h) electrodepositing a second layer of a metal or alloy in the open parts of the second mold in the presence of the metal tie layer, and levelling the metal structure and the second mold by machining so as to obtain a planar upper surface;
   i) if necessary, repeating steps g) and h) so as to form the desired multilayer metal structure; and
   j) detaching the substrate by delaminating the multilayer metal structure obtained and the cured photoresist, separating the photoresist so as to free the multilayer metal structure, then removing that part of the metal tie layer or layers which has not been inserted between two electrodeposited metal layers, so as to obtain the detached multilayer metal structure in which the first layer has a recess and the second layer adjacent the first layer overhangs the recess.

2. The process as claimed in claim 1, wherein after step h) or step i), and before step j), a metal or alloy layer entirely superposed on the metal or alloy layer deposited in step h) or in step i) is produced by UV-LIGA.

3. The process as claimed in claim 1, wherein, prior to step a), a metal or alloy layer, on which said first metal or alloy layer is entirely superposed, is produced by UV-LIGA.

4. The process as claimed in claim 1, wherein the substrate is a stainless steel plate.

5. The process as claimed in claim 1, wherein the substrate has an upper surface that is textured by shot peening or by chemical, mechanical or laser etching.

6. The process as claimed in claim 1, wherein the substrate has a polished upper surface.

7. The process as claimed in claim 1, wherein a plurality of multilayer metal structures are formed simultaneously on the same bulk metal flat substrate and, after step i), at least the cured photoresist accessible in the obverse side of said plurality of structures is removed directionally by a plasma treatment and the unexposed parts of the metal tie layer are removed.

8. The process as claimed in claim 1, wherein said recess is a blind hole.

9. The process as claimed in claim 1, wherein the first mold is directly on the substrate.

* * * * *